United States Patent [19]

Lorenz

[11] Patent Number: 5,367,270
[45] Date of Patent: Nov. 22, 1994

[54] VOLTAGE CONTROLLED OSCILLATOR OPERABLE OVER A LARGE FREQUENCY RANGE

[75] Inventor: Perry Lorenz, Sunnyvale, Calif.

[73] Assignee: National Semiconductor Corporation, Santa Clara, Calif.

[21] Appl. No.: 62,875

[22] Filed: May 18, 1993

[51] Int. Cl.[5] .......................... H03K 3/282; H03B 5/24
[52] U.S. Cl. .............................. 331/113 R; 331/108 C; 331/144; 331/179
[58] Field of Search ..................... 331/59, 108 C, 111, 331/113 R, 144, 179; 307/290, 291

[56] References Cited

U.S. PATENT DOCUMENTS 5,070,311 12/1991 Nicolai ........................ 331/111

Primary Examiner—David Mis
Attorney, Agent, or Firm—Limbach & Limbach

[57] ABSTRACT

A voltage controlled oscillator circuit is shown in integrated circuit chip design form. The frequency range of the circuit is extended by providing switch means for isolating the off-chip frequency determining capacitor and employing a minimum-value on-chip capacitor to control circuit maximum frequency operation. The circuit is based upon a regenerative latch operation which switches a controlled current to charge a capacitor first in one polarity and then in the other polarity. A control voltage determines the charging current and hence the frequency of operation.

5 Claims, 2 Drawing Sheets

VOLTAGE CONTROLLED OSCILLATOR OPERABLE OVER A LARGE FREQUENCY RANGE

BACKGROUND OF THE INVENTION

The invention relates to a voltage controlled oscillator (VCO) circuit which can be controlled by an input voltage to operate over a large frequency range. Typically, such circuits employ a capacitor which is charged and discharged by controlled currents thereby producing a fundamental frequency that is determined primarily by the capacitor value. Such oscillator circuits are useful in FM applications and in phase-locked loop applications. The present circuit is intended for use in integrated circuit (IC) chips. While it can be a stand-alone chip, it is more common to include the VCO along with other circuits on a complex circuit chip. It is intended that the IC form will be the well known monolithic silicon, epitaxial, planar, PN junction isolated structure. Since all of the transistors in the circuit are NPN devices, the frequency of operation can be relatively high.

In VCO circuits, the frequency determining capacitor is typically an off-chip component that is attached, by the user, to the package pins. This is done primarily because the user ordinarily wants to control the circuit frequency in accordance with his system design and does not want to be limited to an arbitrary frequency range.

DESCRIPTION OF THE PRIOR ART

FIG. 1 is a simplified schematic diagram of a commonly used VCO circuit. Terminals 10 and 11 are respectively connected to $+V_{DD}$ and $-V_{EE}$ rails, which provide the operating power. Typically, these rails are at +5 and −5 volts. In its IC form, the circuit will include output terminals 12 and 13. External capacitor pins 14 and 15, which are typically IC chip bonding pads, provide an off-chip capacitor connection means. Capacitor 16 represents the off-chip capacitor which will mainly determine the VCO frequency of oscillation.

Capacitors 17 and 18 are shown in dashed outline because they are parasitic elements representing the stray capacitance to ground of bonding pads 14 and 15. If capacitor 16 is omitted, and bonding pads 14 and 15 unconnected externally, the VCO will have its maximum frequency of oscillation determined by then the values of stray capacitors 17 and 18, which typically are about 4 pf each.

Transistors 20 and 21 form the basic amplifying elements of the VCO. Constant current sinks 22 and 23 couple the emitters of transistors 20 and 21 respectively to the $-V_{EE}$ supply rail. The conductivity of sinks 22 and 23 is commonly controlled by a bias potential applied to control terminal 26. This is the terminal that modulates or controls the operating frequency of the VCO. Frequency is directly proportional to control voltage.

Transistors 20 and 21 have their collectors respectively coupled to the $+V_{DD}$ supply rail by load resistors 24 and 25.

Emitter follower transistors 27 and 28 cross-couple transistors 20 and 21 in a latching configuration which produces regenerative (or oscillatory) feedback. The emitters of transistors 27 and 28, being low impedance circuit nodes, provide a convenient circuit output to terminals 12 and 13.

In operation, transistors 20 and 21 conduct alternately so that only one is on at a time. When transistor 20 is on, it conducts 2I, and terminal 14 is pulled up with respect to terminal 15. As a result, $I_1$ will flow into capacitor 16 to charge it. This conduction in transistor 20 creates a substantial voltage drop across resistor 24 which results in a logic low at output terminal 12 and, therefore, the base of transistor 21. Since little current flows in resistor 25, the base of transistor 28 will be close to the $+V_{DD}$ rail and conduction in transistor 28 will pull output terminal 13 to a logic high. This action pulls the base of transistor 20 high and maintains conduction therein.

It can be seen that bonding pad 14 will be slightly lower than 2 $V_{BE}$ below $+V_{DD}$. Therefore, as capacitor 16 charges, the emitter of transistor 21 will be lowered. As the charge of capacitor 16 continues, and the emitter of transistor 21 falls, a point will be reached where transistor 21 will start to conduct. When this occurs, the collector of transistor 21 will start to fall and transistor 28 will communicate the fall to the base of transistor 20 so that its conduction will decrease.

This in turn will raise the voltage at the collector of transistor 20 so that the base of transistor 21 will rise. This regenerative action will proceed quickly to turn transistor 21 on and transistor 20 off. At this point, output terminal 12 will go to a logic high close to $+V_{DD}$ and output terminal 13 will go to a logic low which is one $V_{BE}$ plus the voltage drop across resistor 25 below the $+V_{DD}$ rail. This switching results in 2I flowing in transistor 21 and $I_1$ will flow into the upper terminal of capacitor 16 thereby reducing its charge. The charge across capacitor 16 will reduce to zero and proceed to charge in the opposite polarity, which action will cause the emitter of transistor 20 to fall. As this charging proceeds, transistor 20 will start to conduct and the cycle is completed. Thus, capacitor 16 will charge and discharge in a cyclic manner as conduction alternates between transistors 20 and 21. Since the charging action is due to a constant current, it will be linear with time so that a back-to-back sawtooth voltage waveform appears across capacitor 16. This waveform is centered about a voltage that is close to two $V_{BE}$ below $V_{DD}$.

The circuit output at terminals 12 and 13 is a square wave and its complement having transitions at the sawtooth peaks.

Clearly, if capacitor 16 is smaller than capacitors 17 and 18, the value of the stray capacitors 17 and 18 will be the major factor determining the oscillator maximum frequency which occurs when sinks 22 and 23 are at their maximum conduction. In many oases, this maximum frequency is not as high as would be desired and an extension of the maximum frequency would be desirable.

SUMMARY OF THE INVENTION

It is an object of the invention to extend the operating frequency range in a VCO circuit.

It is a further object of the invention to extend the operating frequency range in an IC VCO in a manner that can be controlled by the IC user.

It is a still further object of the invention to employ an IC VCO circuit in which the effects of the external frequency determining capacitor and related stray capacitances can be switched off by the IC user thereby to invoke an extended maximum frequency.

These and other objects are achieved in a VCO circuit configured as follows. A conventional VCO IC is employed where an external capacitor mainly determines the frequency of oscillation. However, the constant current sinks that vary the frequency can be turned off by the IC user by means of an equivalent switch. A pair of transistors are added to the circuit so that their collector and base electrodes are connected to the equivalent basic amplifier elements. The added transistors each have their emitters coupled by an added pair of constant current sinks which have their control elements connected to the control input terminal. The emitters of the added transistors are connected to a minimum value capacitor on the IC which will therefore control the frequency of operation of the circuit when the basic current sinks are turned off. When the switch that is used to turn off the sinks is activated, the basic current sinks will be off and the bonding pads, as well as the external capacitor (if present), will be inoperative. Thus, the maximum frequency of operation will be limited only by the minimum value capacitor. The result is a substantial increase in the VCO maximum frequency of operation.

A better understanding of the features and advantages of the various aspects of the present invention will be obtained by reference to the following detailed description and accompanying drawings which set forth an illustrative embodiment in which the principles of the invention are utilized.

DESCRIPTION OF THE INVENTION

Figure 2:
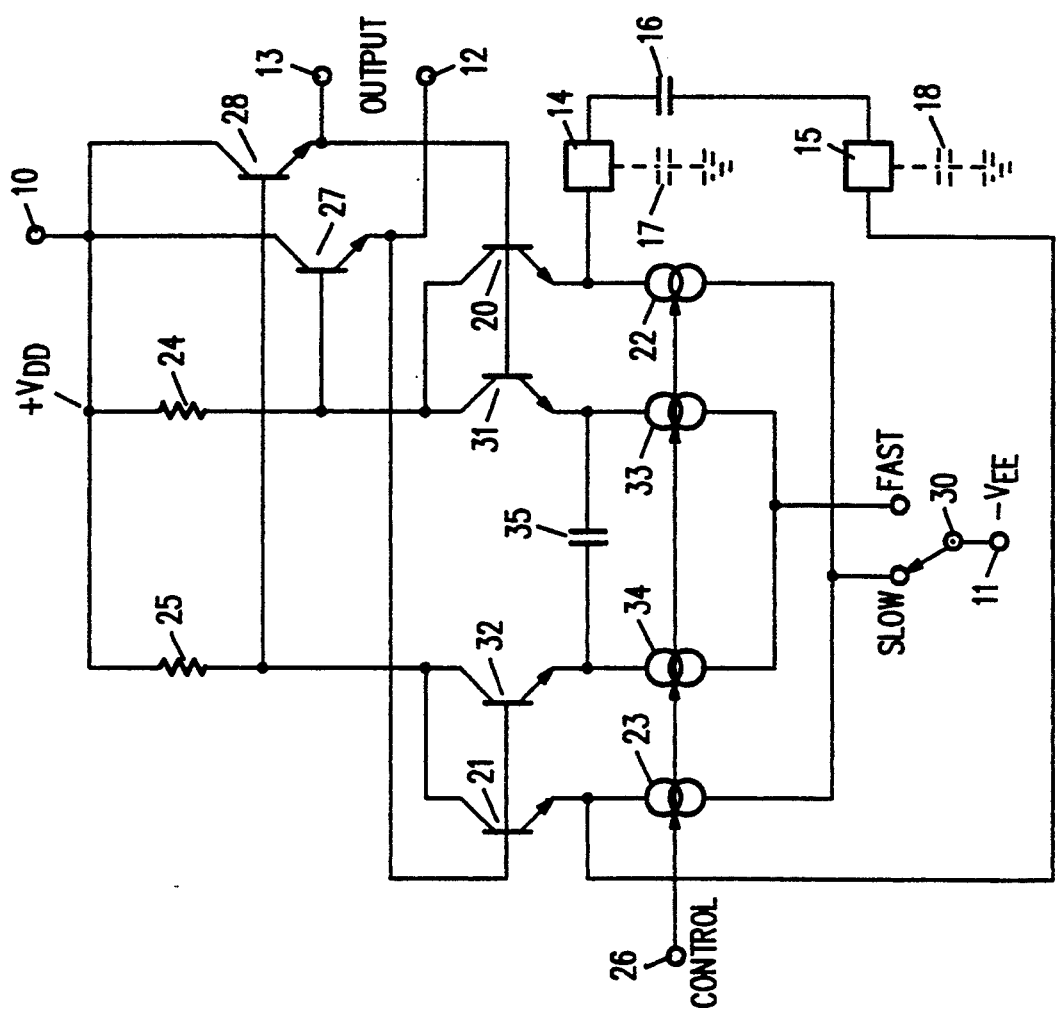
FIG. 2 is a simplified schematic diagram illustrating the circuit of the invention.
Figure 1:
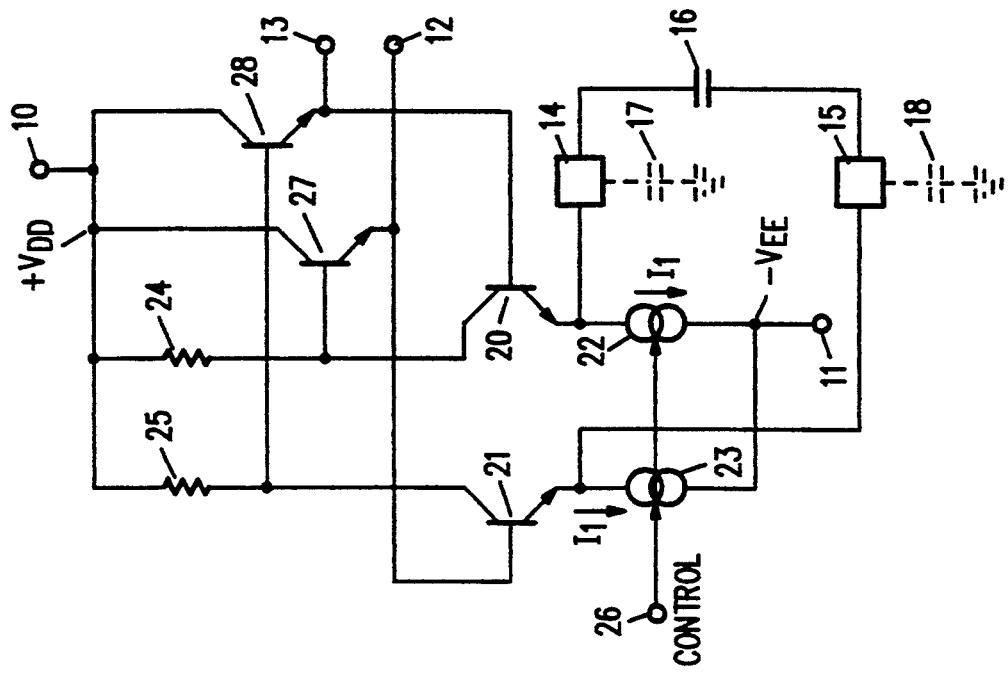
FIG. 1 is a simplified schematic diagram illustrating a prior art VCO circuit.

FIG. 2, which discloses an embodiment of a circuit in accordance with the invention, is an extension of the FIG. 1 circuit. Where the elements are the same, the same numerals are employed. Thus, elements 10 through 28 function in the same way as those of FIG. 1 except for the action of switch 30.

Switch 30 is shown as a SPDT element which has its armature connected to the $-V_{EE}$ terminal. Switch 30 functions to activate sinks 22 and 23 when the armature is in the position illustrated. In the SLOW switch position shown, sinks 22 and 23 function normally so that capacitor 16, which is selected by the IC user, will dominate the circuit operation.

Transistors 31 and 32 have their collector and base electrodes connected respectively to those of transistors 20 and 21. When switch 30 is in its FAST position, the emitter of transistors 31 and 32 are respectively returned to the $-V_{EE}$ rail by way of constant current sinks 33 and 34 which have their control electrodes connected to control terminal 26 along with those of sinks 22 and 23. A minimum value capacitor 35 is connected between the emitters of transistors 31 and 32. Thus, when switch 30 is in the FAST position, transistors 31 and 32 are on so that capacitor 35 controls the oscillator frequency. Desirably, capacitor 35 is selected to achieve the highest possible frequency of oscillation. Then, as the frequency is lowered by reducing the control terminal potential, the lowest frequency will desirably overlap the highest frequency produced by the circuit when capacitor 16 is functional. This provides a complete range of operation from the highest possible frequency for the transistors employed to as low a frequency as the user wants to impose, as determined by the value of capacitor 16. In the interest of highest maximum frequency, transistors 31 and 32 will be minimum geometry devices for the process being employed to manufacture the IC and current sinks 33 and 34 will be designed to pass a constant current having a value close to the $I_{MAX}$ of the transistors.

While switch 30 is shown in conventional SPDT form, it can actually be in the form of IC chip bonding pads made available by way of IC package pins where sinks 22 and 23 are connected to one bonding pad and sinks 33 and 34 are connected to another. The switch action is a result of which of the bonding pads is connected to $-V_{EE}$.

Figure 3:
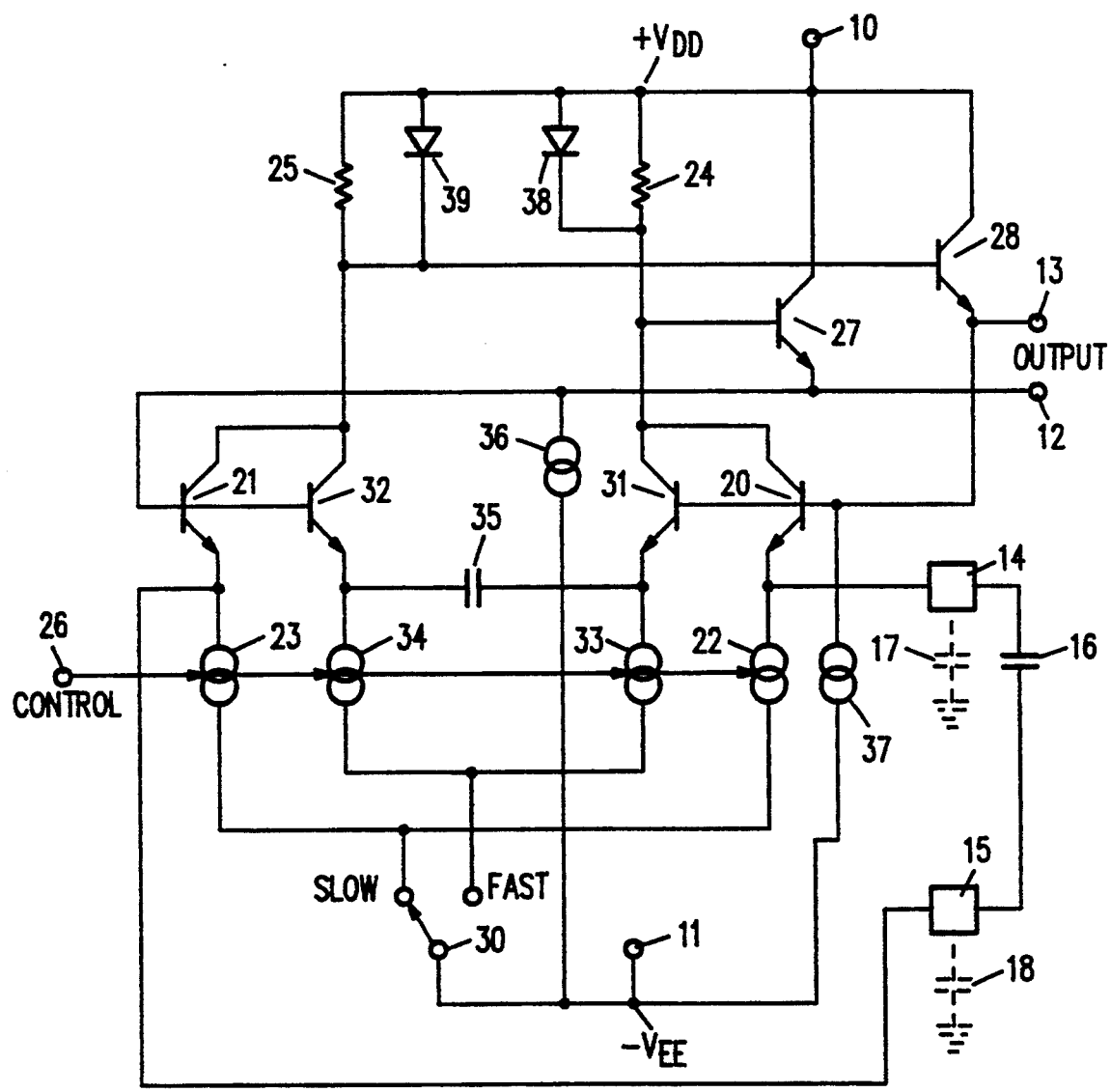
FIG. 3 is a simplified schematic diagram illustrating an alternative embodiment of the invention.

FIG. 3 is a simplified schematic diagram of an alternative embodiment of the invention. Relatively slight modifications of the circuit of FIG. 2 are evident. Two additional constant current sinks, 36 and 37, have been added (as shown), along with two diodes, 38 and 39.

The constant current sinks 36 and 37 respectively, couple the emitters of transistors 27 and 28 to the $-V_{EE}$ supply rail and therefore act as loads for these emitter followers. These current sinks keep the emitter followers continuously active thereby stabilizing their operation and keeping their level shifts constant.

Diodes 38 and 39 respectively shunt load resistors 24 and 25. This means that when either transistors 20 and 21 or transistors 31 and 32 are conductive, the maximum voltage drop across resistors 24 or 25 will be limited to one $V_{BE}$. This acts to stabilize the output amplitude at terminals 12 and 13 even though the voltage at control terminal 26 varies.

Other well known VCO circuit modifications can also be employed. For example, conduction in the current sources can be varied with temperature in order to reduce or compensate the circuit frequency variation with temperature. Also, precision clamping can be employed to minimize the output amplitude variations with temperature.

EXAMPLE

The circuit of FIG. 2 is fabricated in the form using conventional monolithic silicon, epitaxial, PN junction isolated, planar processing. Resistors 24 and 25 are 700 ohms each, transistors 31 and 32 are of minimum geometry (18 square microns emitters) and capacitor 35 has a value of 1 pf. Capacitor 16 is 5 pf. The circuit is operated usimg a 10-volt supply. With switch 30 in the SLOW position, the maximum frequency of oscillation (capacitors 16–18 present) is 29 MHz. With switch 30 in the OFF position (capacitors 16–18 inoperative) the maximum frequency of oscillation is 143 MHz.

The invention has been described and a preferred embodiment detailed. An alternative embodiment has also been described. When a person skilled in the art reads the foregoing description, other alternatives and equivalents, within the spirit and intent of the invention, will be apparent. Accordingly, it is intended that the scope of the invention be limited only by the claims that follow.

I claim:

1. A voltage controlled oscillator circuit having positive and negative supply rails connectable to a source of operating power, the circuit comprising:

first and second bipolar transistors (20 and 21) having their collectors respectively coupled to one of said supply rails by means of a pair of load elements (24 and 25), their emitters coupled to the opposite supply rail by means of a first pair (22 and 23) of current control elements;

means for coupling a first capacitor (16) between said emitters of said first and second bipolar transistors;

a pair of emitter follower bipolar transistors (27 and 28) connected to cross couple the bases and collectors of said first and second bipolar transistors whereby a regenerative feedback is created between said first and second bipolar transistors;

third and fourth bipolar transistors (31 and 32) having their respective base and collector electrodes connected in parallel with those elements in said first and second bipolar transistors and having their emitters respectively coupled to said opposite supply rail by means of a second pair of current control elements (33 and 34);

a second capacitor (35) coupled between said emitters of said third and fourth bipolar transistors and having a minimum capacitance value; and means (30) for selectively switching either said first pair or said second pair of current control elements to said opposite supply rail whereby only said first and second or said third and fourth bipolar transistors respectively, are operative at a time.

2. The voltage controlled oscillator circuit of claim 1, wherein said circuit is in monolithic integrated circuit chip form and said first capacitor is an off-chip component.

3. The voltage controlled oscillator circuit of claim 2, wherein said second capacitor is selected to have a minimum capacitance value.

4. The extended range voltage controlled oscillator circuit of claim 1, wherein said pair of emitter follower bipolar transistors each have a constant current load coupled between their respective emitters and said negative supply rail.

5. The extended range voltage controlled oscillator circuit of claim 1, wherein each one of said pair of load elements is shunted by a diode connected to be forward biased by the collector currents in said first and second bipolar transistors.

* * * * *